US011800691B2

(12) United States Patent
Oseen-Senda et al.

(10) Patent No.: US 11,800,691 B2
(45) Date of Patent: Oct. 24, 2023

(54) PASSIVE TWO-PHASE COMPUTER COOLING

(71) Applicant: Microsoft Technology Licensing, LLC, Redmond, WA (US)

(72) Inventors: Kathryn Oseen-Senda, Seattle, WA (US); Douglas P. Kelley, Sammamish, WA (US); Alexis Grace Schubert, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/547,554

(22) Filed: Dec. 10, 2021

(65) Prior Publication Data

US 2023/0189486 A1    Jun. 15, 2023

(51) Int. Cl.
  *H05K 7/20*    (2006.01)

(52) U.S. Cl.
  CPC ..... *H05K 7/20818* (2013.01); *H05K 7/20736* (2013.01)

(58) Field of Classification Search
  CPC ................. H05K 7/20818; H05K 7/20736
  See application file for complete search history.

(56) References Cited

U.S. PATENT DOCUMENTS

| 11,076,505 | B2 | 7/2021 | Gao |
| 2017/0142868 | A1 | 5/2017 | Chen et al. |
| 2020/0113085 | A1* | 4/2020 | Schon ............ F25D 17/02 |
| 2020/0337176 | A1 | 10/2020 | Aoki et al. |
| 2021/0153392 | A1 | 5/2021 | Gao |
| 2022/0400585 | A1* | 12/2022 | Gao ............ H05K 7/20318 |

FOREIGN PATENT DOCUMENTS

| CN | 113093890 A | 7/2021 |
| WO | 2018164084 A1 | 9/2018 |

OTHER PUBLICATIONS

"International Search Report and Written Opinion Issued in PCT Application No. PCT/US22/043921", dated Dec. 12, 2022, 18 Pages.

* cited by examiner

*Primary Examiner* — Mukundbhai G Patel
(74) *Attorney, Agent, or Firm* — Rainier Patents, P.S.

(57) ABSTRACT

The description relates to passive two-phase immersion cooling of computers, such as servers. One example can include multiple liquid immersion tanks configured to contain servers immersed in a liquid-phase of a coolant having a boiling point below a maximum operating temperature of the servers such that operation of the servers generates heat that is transferred to the liquid phase of the coolant and causes a portion of the coolant to boil to a gas phase of the coolant. The example can include a single phase separator tank and a single heat exchanger coupled to the multiple liquid immersion tanks as a sealed cooling system and configured to receive the gas phase of the coolant and configured to transition the gas phase of the coolant back to the liquid phase of the coolant and to automatically deliver liquid phase of the coolant to an individual liquid immersion tank responsive to further boiling producing additional gas phase of the coolant that evacuates the individual liquid immersion tank.

20 Claims, 6 Drawing Sheets

PASSIVE TWO-PHASE COMPUTER COOLING

BACKGROUND

Two-phase cooling has been contemplated for various devices. However, effectively managing two-phase cooling systems has proven daunting. For instance, if proper liquid level is not maintained, components that are generating high heat loads may be coolant starved and boil dry. Toward this end, monitoring systems can be employed to provide information to control pumping systems so that components do not boil dry. However, these existing systems tend to be complicated, expensive, and unreliable. The present concepts can address these and/or other issues.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

DETAILED DESCRIPTION

Figure 1A:
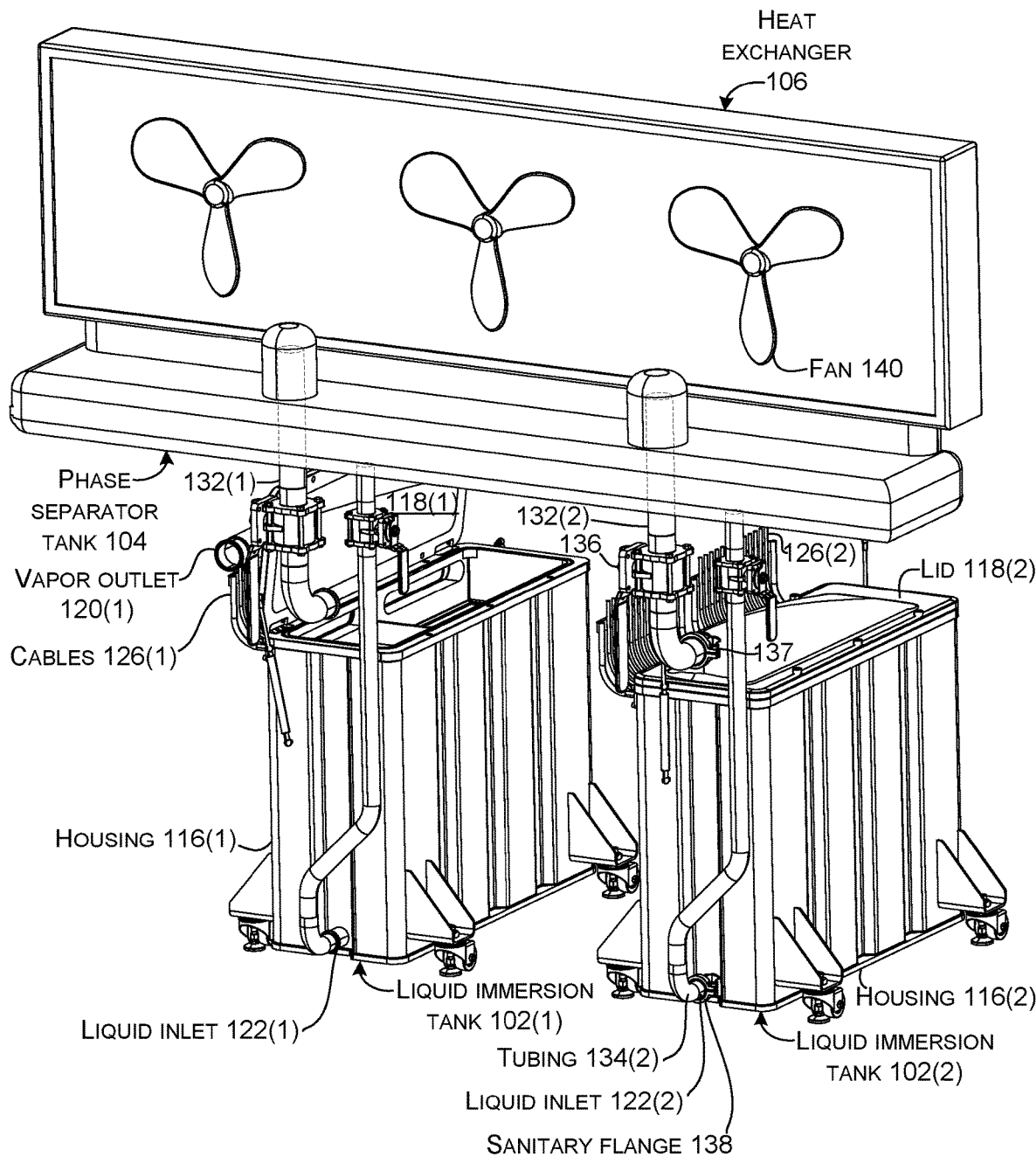
FIGS. 1A-1C and 2 show perspective views of example devices and systems in accordance with some implementations of the present concepts.

The present concepts relate to two-phase immersion cooling of computing components, such as servers, processors, memory, storage, and/or power conversion components. Two-phase immersion cooling can remove large amounts of heat per volume of space and thus can allow high computer density and performance without overheating. Heat from the computing components can boil coolant liquid (e.g., liquid phase coolant) into coolant vapor (e.g., gas phase coolant) (hence the term 'two-phase cooling'). The gas phase coolant can carry the heat from the computing components to a different area of the cooling system where the heat can be transferred to an external cooling system. As a result of the energy transfer, the gas phase coolant returns to the liquid phase. The liquid phase coolant can be recycled to start the cooling process again for the computing components.

Various two-phase immersion coolants have suitable properties for use in the two-phase immersion cooling systems. Suitable two-phase immersion coolants tend to be electrically insulative and non-corrosive. Fluorochemicals provide an example class of two-phase immersion coolants that can possess these properties, such as being electrically insulative, non-corrosive, and having suitable boiling points. For instance, a suitable boiling point can be within, or slightly below, an operating temperature range of the computing components. For instance, computing components having an operating range of 70-80 degrees Celsius can be paired with a two-phase immersion coolant that has a boiling point in a range from about 50 degrees to about 75 degrees Celsius, for example. Commercially available example fluorochemicals include the Novec brand engineered fluids offered by 3M Corp, among others.

Two-phase immersion cooling offers advantages at data centers where high numbers of computers or servers, with their various computing components, run at high performance levels and are physically positioned in close proximity to one another (e.g., at high computer densities). However, existing two-phase cooling systems tend to actively pump coolant from the heat producing computing components to a heat exchanger and/or back to the computing components. From another perspective, existing two-phase cooling systems tend to rely on pumping to facilitate adequate coolant flow. When the computing components generate heat at different rates, the higher heat generating computing components may over time not receive enough coolant return and then the liquid coolant level drops below the heat producing component (e.g., boiling dry). To address this, coolant monitoring systems have been employed to control the pumping rate and/or destination. Such configurations result in increased system complexity and multiple points of failure.

Previously attempted two-phase cooling configurations used a large tank with heat exchangers that protruded into the overhead vapor space of the tank. Vapor would condense on the heat exchanger tubes and liquid would drip down into the liquid-filled space in which components were immersed. The heat exchangers typically cannot operate at full efficiency because the tanks have air contamination which migrates to the cold surface of the heat exchanger and blankets it, reducing the saturation vapor temperature. This means that the heat exchangers have to be oversized and colder than they would otherwise need to be. This thermal design also requires two thermal interfaces between the condensing vapor and the exterior ambient air. The first thermal interface involves the heat exchanger surface to the chilled water and the second thermal interface involves the chilled water to the ambient air. More interfaces and/or oversized heat exchangers reduce the efficiency of the system, leading to increased energy and water consumption.

The present concepts provide an improved design in which a heat exchanger can be used to directly condense the vapors for one or more liquid immersion tanks. This configuration can decouple the optimal heat exchanger sizing from the optimal liquid immersion tank sizing, and can reduce capital expenditures and permit the re-use of fluid infrastructure components even as the computing components and liquid immersion tank geometries continue their rapid turnover, such as every 3-5 years.

In some of the present configurations, air and other non-condensables may be purged at the heat exchanger to increase efficiency. In addition, the liquid phase of the coolant can be filtered outside the liquid immersion tank to centralize chemical operations and further reduce costs. The remote heat exchanger may be directly air-cooled (either inside or outside the building) and/or can be water cooled.

FIGS. 1A-1D collectively show an example passive two-phase computer cooling system (hereinafter, 'system') 100. In this case, the system 100 can include one or more liquid immersion tanks 102, a phase separator tank 104, and a heat exchanger 106. The present concepts allow multiple liquid immersion tanks 102 to be supported by a single phase separator tank 104 and a single heat exchanger 106. This implementation shows a two-to-one-to-one ratio where liquid immersion tanks 102(1) and 102(2) are supported by phase separator tank 104 and heat exchanger 106. Other implementations can pair more than two liquid immersion tanks 102 per phase separator tank 104 and heat exchanger 106. One such example is illustrated relative to FIG. 2. A one-to-one-to-one ratio can also be employed.

Figure 1B:
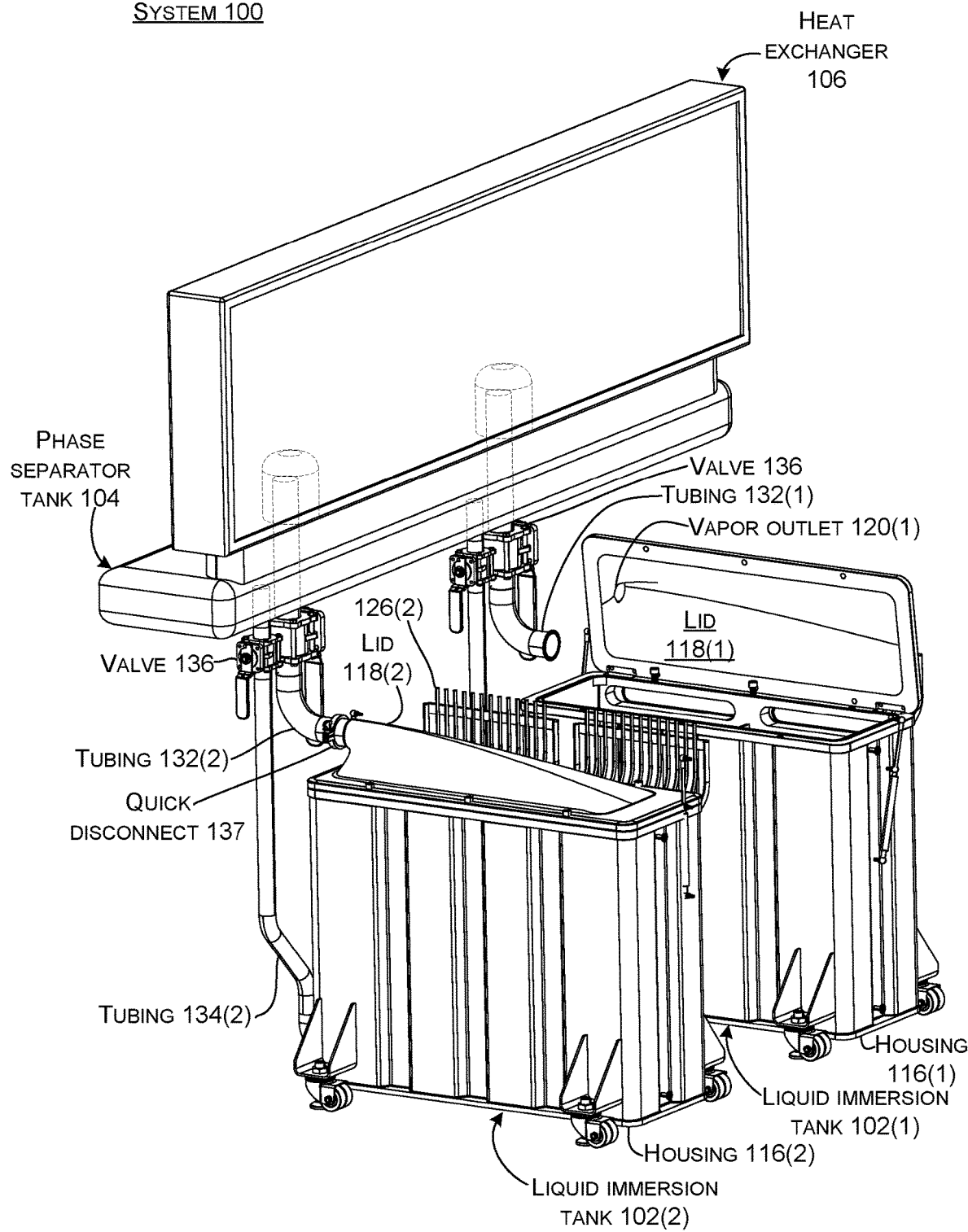
Figure 1C:
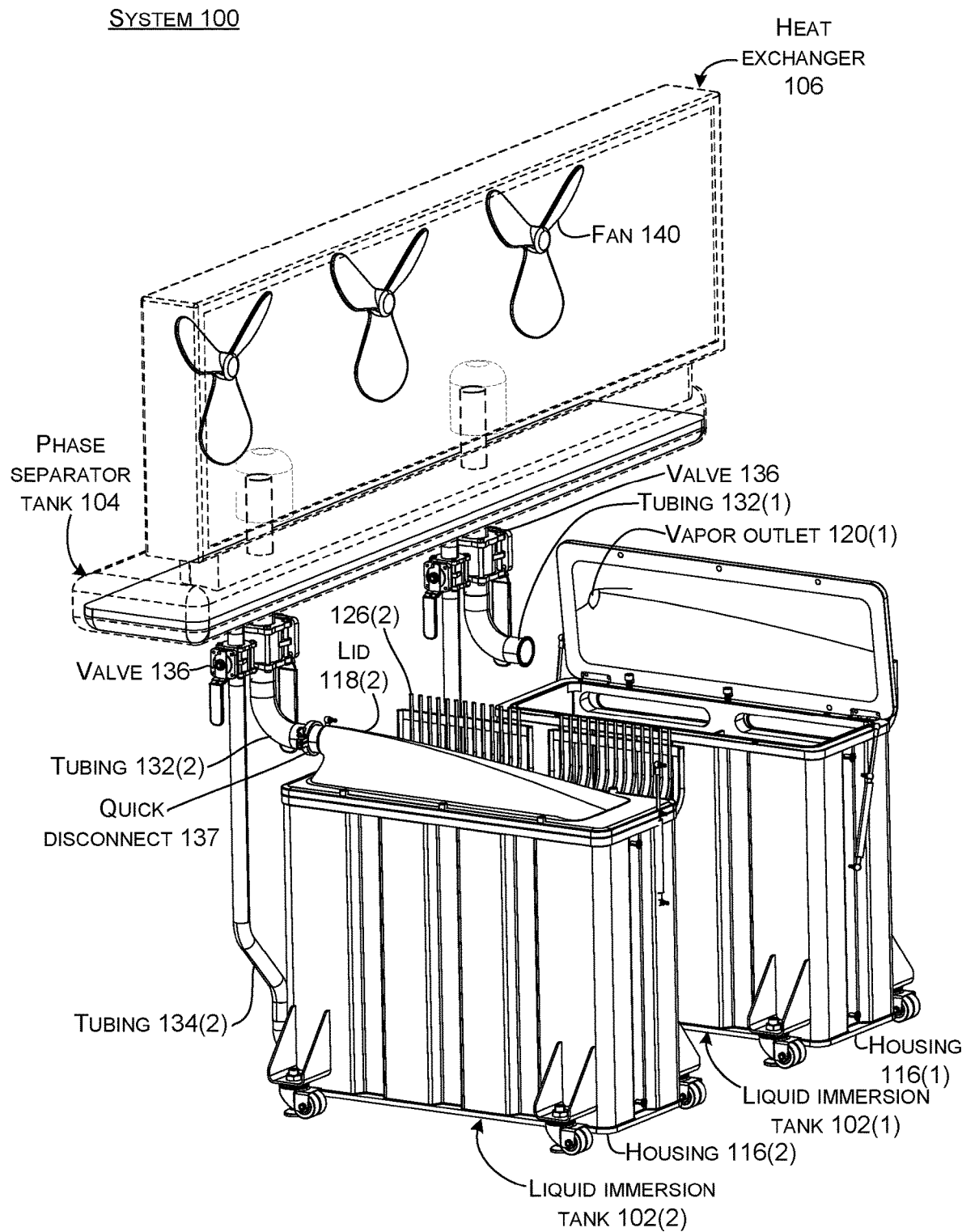
Figure 1D:
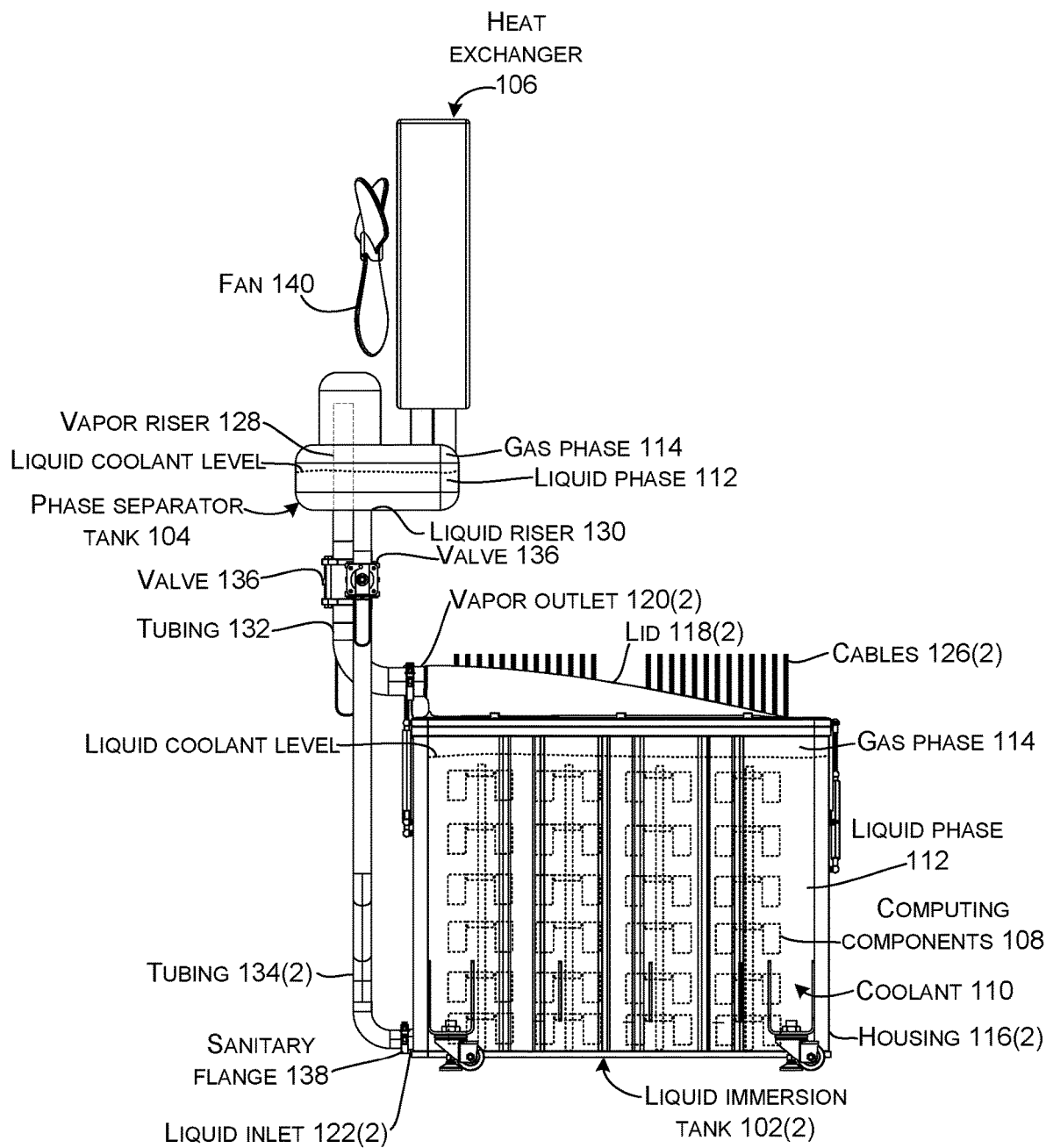
FIGS. 1D and 3 show elevational views of example devices and systems in accordance with some implementations of the present concepts.

The liquid immersion tanks 102 can house computing components 108 (shown in FIG. 1D). The computing components 108 can be assembled as complete or discrete computers (e.g., servers). Alternatively, the computing components can be organized by component type, such as groups of central processing units (CPUs), groups of graphics processing units (GPUs), groups of memory, groups of storage, etc. In either configuration, the computing components 108 can be directly immersed in, and contacted by, two-phase coolant 110. Specifically, the computing components 108 can be immersed in a liquid phase 112 of the coolant 110. (The terms 'liquid phase' and 'liquid phase coolant' are used interchangeably). Heat produced by operation of the computing components 108 can cause liquid phase coolant 112 to warm and phase change (e.g., boil) into gas phase 114 of the coolant 110. (The terms 'gas phase' and 'gas phase coolant' are used interchangeably). From one perspective, the boiling drives coolant movement through buoyancy-driven upward flow up and out of the liquid immersion tank 102. The high energy coolant that flows up out of the liquid immersion tank includes pure gas phase coolant and/or a mixture carrying some amount of liquid phase coolant with the gas phase coolant. The high energy coolant that leaves the top of the liquid immersion tank is replaced by liquid coolant that enters the liquid immersion tank and settles toward the bottom due to its relatively higher density.

In the illustrated configuration the liquid immersion tanks 102 can include a housing 116 and a lid 118, which in this case is attached to the housing with a hinge (shown but not designated) (e.g., a hinged access lid). The lid 118 can provide access to the computing components 108. FIGS. 1A-1C show lid 118(1) open and lid 118(2) closed.

The liquid immersion tanks 102 can also include a vapor outlet 120 positioned relatively high on the liquid immersion tank and a liquid inlet 122 that can be positioned lower on the liquid immersion tank. In this case the vapor outlet 120 is positioned on the lid 118 and the liquid inlet 122 is positioned on the housing 116.

The liquid immersion tanks 102 can also include sealing access points (designated at 216 in FIG. 2) for cables 126 (e.g., power and/or data cables) connected to the computing components 108. The sealing access points can provide a pathway from the cables 126 through the housing 116 without coolant leakage.

The phase separator tank 104 can include a vapor riser 128 and a liquid riser 130. The vapor riser 128 can be coupled to an upper region of the liquid immersion tank, which in this case is the vapor outlet 120, such as by tubing 132. The liquid riser 130 can be coupled to a relatively low region of the liquid immersion tank, which in this case is the liquid inlet 122, such as by tubing 134. In some cases, the tubing 132 and 134 may be interrupted by valves 136 that can stop the flow of coolant through the tubing. Some implementations can employ double valves that can be closed to allow an individual liquid immersion tank 102 to be removed from the system without coolant leakage from either end of the tubing. Another liquid immersion tank can be connected in its place. In some implementations, the removed liquid immersion tank can be moved to a service room that is configured to handle coolant escapement when the liquid immersion tank is opened to service the computing components 108. Liquid immersion tank removal and addition can also be facilitated by quick connects/disconnects 137 and/or sanitary flanges 138 (designated on FIG. 1A relative to liquid immersion tank 102(2)). The quick connects/disconnects 137 can couple the tubing 132 to the vapor outlet 120. The sanitary flanges 138 can couple the tubing 134 to the liquid inlet 122.

Figure 2:
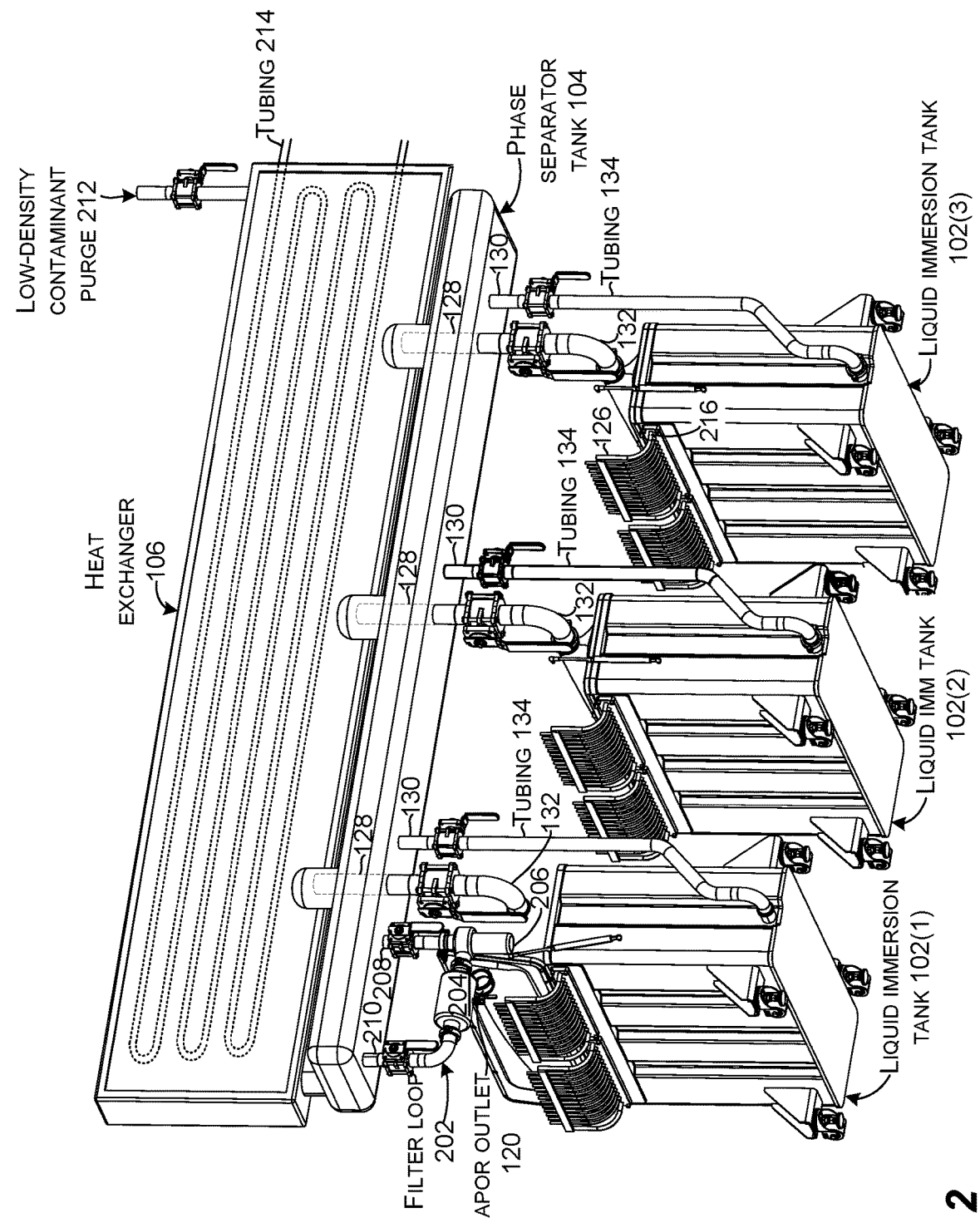

The heat exchanger 106 can be fluidly coupled to, and above, the phase separator tank 104. An alternative configuration is illustrated relative to FIG. 3 where the heat exchanger and the phase separator tank are integrated as one unit. In the illustrated configuration of FIGS. 1A-1D, the heat exchanger 106 is mounted above and fluidly coupled to the phase separator tank 104. Gas phase coolant 114 rises from the phase separator tank 104 into the heat exchanger 106. The heat exchanger 106 functions to transfer heat from the gas phase 114 coolant to other matter. For instance, fans 140 are illustrated in this implementation. The fans increase airflow over the heat exchanger 106 to transfer heat from the gas phase coolant to air blowing past the heat exchanger. FIG. 2 illustrates an alternative configuration where a secondary coolant, such as water, is pumped or otherwise circulated through the heat exchanger to receive heat from the gas phase coolant 114. Regardless of the heat transfer technique employed, the gas phase coolant 114 is cooled and eventually phase changes (e.g., transitions) back into liquid phase coolant 112 and drips or otherwise travels back to the phase separator tank 104. From this perspective, the heat exchanger 106 can function as a condenser for the coolant 110.

In the phase separator tank 104, the level of the liquid phase coolant 112 can be higher than the liquid riser 130 and lower than the vapor riser 128. Recall that coolant boiling from heat generated by the computing components 108 in the liquid immersion tank 102 rose up and exited the liquid immersion tank 102 through the vapor outlet 120. This evacuated gas phase coolant 114 is automatically replaced by cool, dense, liquid phase coolant 112 from the phase separator tank 104 that flows into the liquid riser 130, down tubing 134, and into the liquid immersion tank 102 through the liquid inlet 122. The cool and dense liquid phase coolant 112 tends to sink in the liquid immersion tank 102 and will rise as it is warmed by heat from computing component operation.

Note that the rate at which liquid phase coolant 112 flows (e.g., returns) to the liquid immersion tank 102 is controlled by the amount of gas phase coolant 114 that exits the top of the liquid immersion tank 102. Thus, no external monitoring and/or pumping is required. This feature can allow multiple liquid immersion tanks 102 to be coupled to a common phase separator tank 104 and heat exchanger 106 and liquid coolant levels in individual liquid immersion tanks will automatically be maintained without control or pumping inputs. This coolant level can be automatically maintained even with differing levels of operation of the computing components in individual liquid immersion tanks because the coolant flow rate is driven and controlled by heat from the computing components within that individual liquid immersion tank.

In light of the aspects discussed above, the present implementations can provide a technical solution of automatically providing sufficient fluid flow for adequate cooling of computing components 108 in each individual liquid immersion tank 102. No liquid immersion tank receives more or less instantaneous flow than it needs. Further, this technical solution is accomplished without any coolant pumps to circulate coolant through the system or sensors to monitor coolant levels and/or temperatures. Instead, proper coolant circulation can be passively driven by operation of the computing components (e.g., by waste heat energy) and does not require expensive electricity input to power circulation pumps. Thus, the present implementations can be less expensive and more reliable than existing systems.

FIG. 2 shows another example system 100A that is similar to system 100 illustrated relative to FIGS. 1A-1D. This implementation includes three liquid immersion tanks 102(1)-102(3) coupled to common phase separator tank 104 and heat exchanger 106. The present concepts also lend themselves to more than three liquid immersion tanks sharing a phase separator tank and a heat exchanger. Such a many-to-one-to-one configuration can reduce costs compared to a one-to-one-to-one configuration. As mentioned above, this many-to-one-to-one relationship works satisfactorily without coolant pumping or coolant level monitoring because each liquid immersion tank drives the amount of liquid phase coolant it receives based upon the amount of gas phase coolant it evacuates.

In this implementation, system 100A includes a filter loop 202 that is configured to filter contaminants from liquid phase coolant (112, FIG. 1D) in the phase separator tank 104. The filter loop 202 can include a pump 204 and a filter 206 that are coupled to the phase separator tank 104 by inlet tubing 208 and outlet tubing 210. The filter loop 202 can function to filter contaminants that are carried by the liquid phase coolant, such as various plastic and/or metal contaminants from the cooling system (e.g., from the tubing, housing, conductors, insulators, etc.). The filter loop 202 can include valves, which are shown but not designated, to isolate the filter loop to service the pump 204 and/or the filter 206. The filter loop 202 can be isolated from the coolant tubing 132 and 134 that couples the liquid immersion tanks 102 to the phase separator tank 104. Thus, computing component cooling is not reliant upon circulation through the filter loop and/or provided by the pump 204. In contrast, the filter loop (e.g., the pump 204) can be run intermittently and/or as needed without affecting the cooling capability of the system 100A. Further, satisfactory coolant filtering can be achieved with liquid coolant flow through the filter loop that is only a small fraction of the overall coolant flow rate through the system. Thus, pump power consumption can be much lower than when pumping is relied upon to move coolant through a traditional system.

System 100A can also include a low-density contaminant purge 212. The low density contaminate purge 212 can function to remove low density contaminant gases (e.g., non-condensables), such as air and/or water vapor from the system 100A. The low-density contaminant purge 212 can include tubing and a valve. The tubing can extend upwardly from an upper portion of the heat exchanger 106. The valve can be opened to remove contaminants on an as-needed basis, such as after opening or replacing an individual liquid immersion tank 102.

FIG. 2 also illustrates an alternative configuration where tubing 214 runs through the heat exchanger and carries a secondary coolant, such as water, through the heat exchanger to receive heat from the gas phase coolant 114. The warmed secondary coolant can be circulated away and replaced by new, cool secondary coolant. The secondary coolant can remove the heat from the system 100A and transfer the heat to another environment, such as an external environment. The tubing 214 and secondary cooling fluid can be utilized alone or in combination with the fan cooling described above relative to FIGS. 1A-1D.

FIG. 2 also shows sealing access points 216 (designated relative to liquid immersion tank 102(3)). The sealing access points 216 provide a seal around the cables 126 as they exit the liquid immersion tank. Thus, the liquid immersion tanks 102, phase separator tank 104, heat exchanger 106, the associated tubing 132, 134, valves 136, and/or sealing access points 216 can create a sealed cooling system during operation, while allowing ready serviceability within an individual liquid immersion tank and/or by swapping out individual liquid immersion tanks.

Figure 3:
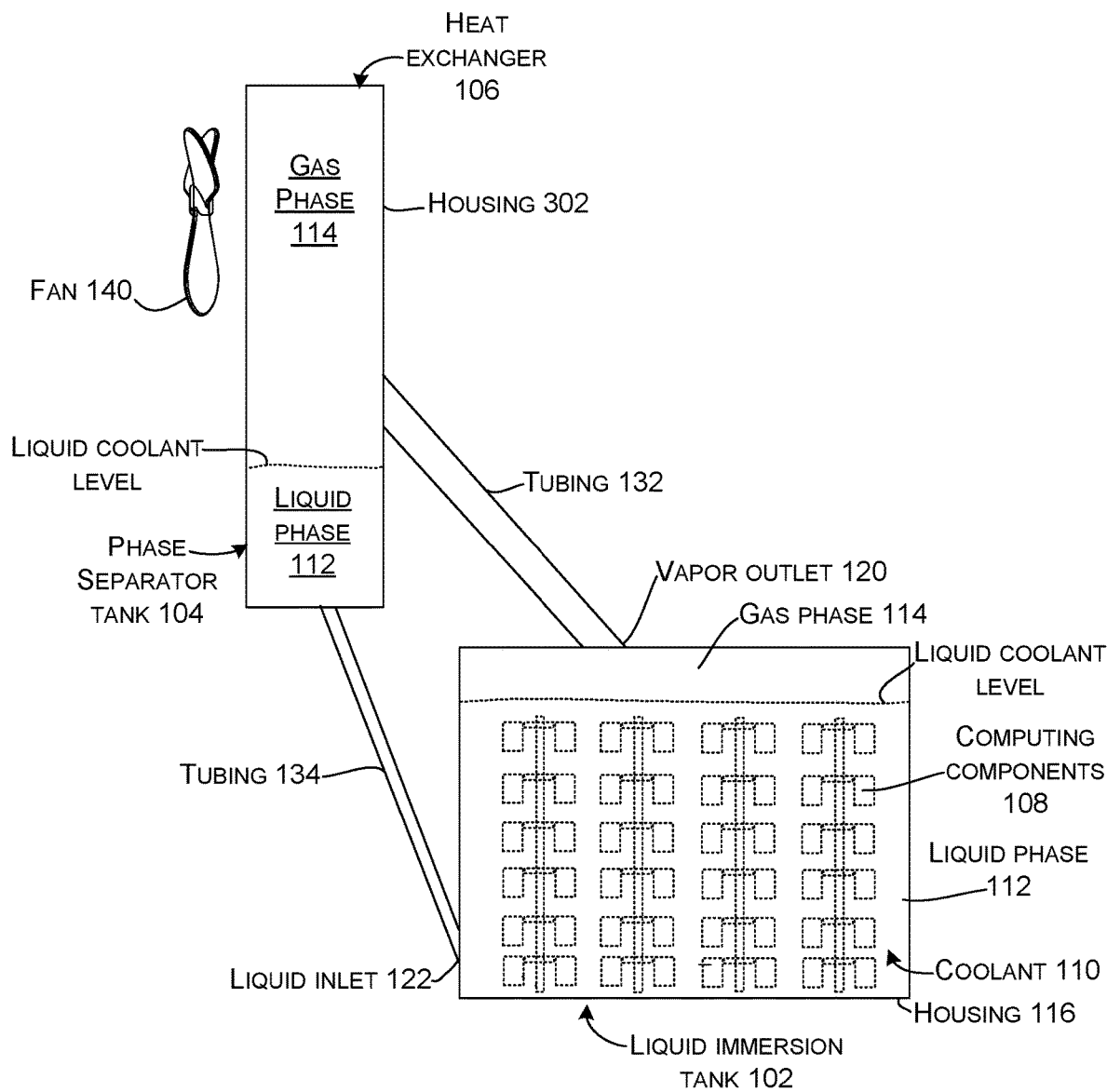

FIG. 3 shows another example system 100B. This system is similar to systems 100 and/or 100A. In this implementation, the phase separator tank 104 and the heat exchanger 106 are integrated into a single housing 302. The heat exchanger 106 can be positioned above the phase separator tank 104. Upon operation of the computing components 108, gas phase coolant 114 can rise up tubing 132 into the phase separator tank 104. Note that the gas phase coolant rising up tubing 132 can be entirely gas phase coolant or the gas phase coolant may be mixed with hot liquid phase coolant 112. Upon entering the phase separator tank 104, this gas phase coolant (pure or mixed) separates by density; liquid phase coolant 112 sinks further in the phase separator tank 104 and gas phase coolant 114 rises into the heat exchanger 106. The gas phase coolant 114 can be cooled in the heat exchanger 106 until it phase changes back to liquid phase coolant 112. The liquid phase coolant 112 can drip or otherwise flow into the phase separator tank 104.

The phase separator tank 104 can store the liquid phase coolant 112 until the liquid phase coolant flows down tubing 134 and into the liquid inlet 122 to replace additional mixed phase coolant or gas phase coolant 114 that rises out of the liquid immersion tank 102. At this point, the pressure in the liquid immersion tank 102 is lowered and relatively cool liquid phase coolant 112 flows from the lower regions of the phase separator tank 104 down the tubing 134 and into the liquid immersion tank 102. Because this returning liquid phase coolant 112 is relatively cool and dense, it tends to sink in the liquid immersion tank 102 and rises as it is heated by operation of the computing components 108.

The present concepts can eliminate reliance on pumps to circulate two-phase immersion coolant. If pumps are used to circulate coolant to one or more liquid immersion tanks, then the pumps become a critical failure point. The present concepts further eliminate the management systems required to ensure that individual computing components receive enough return coolant flow because coolant circulation can be driven by heat generation from the individual computing components (e.g., higher heat generation produces higher coolant flows). The present passive thermosiphon applications can eliminate the largest potential failure mechanism by eliminating the pumps as well as reducing maintenance costs. The pumps of traditional systems also comprise one of the larger capital expenditure elements of the previous designs. The present implementations include system designs that provide adequate liquid coolant height to provide sufficient gravitational impetus to the coolant fluid so that heat from computer operation in an individual liquid immersion tank automatically drives the rate of coolant evacuation from, and return to, that individual liquid immersion tank independent of the other liquid immersion tanks.

The systems and associated elements described relative to the present concepts can be formed with materials known in the immersion cooling and/or data center technologies. The systems and associated elements can be assembled and/or operated with various methods that are consistent with the present description.

Various examples are described above. Additional examples are described below. One example includes a system comprising a liquid immersion tank configured to contain computing components positioned directly in liquid phase of a coolant having a boiling point below a maximum operating temperature of the computing components such that operation of the computing components generates heat that is transferred to the liquid phase of the coolant and causes a portion of the coolant to boil to a gas phase, the liquid immersion tank defining a vapor outlet positioned relatively high on the liquid immersion tank and a liquid inlet positioned relatively lower on the liquid immersion tank, a phase separator tank positioned above the liquid immersion tank and comprising a vapor riser and a liquid riser positioned in the phase separator tank and the vapor riser coupled to the vapor outlet and extending higher than the liquid riser that is coupled to the liquid inlet, and a heat exchanger positioned above and fluidly coupled to the phase separator tank and configured to remove energy from the gas phase of the coolant so that the gas phase of the coolant transitions back to the liquid phase of the coolant that flows into the phase separator tank, and wherein a rate of flow of coolant from the liquid immersion tank to the phase separator tank is automatically controlled by coolant boiling associated with operation of the computing components.

Another example can include any of the above and/or below examples where the vapor outlet is configured to carry a mixture of gas phase coolant and liquid phase coolant from the liquid immersion tank to the phase separator tank.

Another example can include any of the above and/or below examples where the liquid immersion tank comprises a first liquid immersion tank and the vapor riser comprises a first vapor riser and the liquid riser comprises a first liquid riser and further comprising a second liquid immersion tank coupled to the phase separator tank at a second vapor riser and a second liquid riser.

Another example can include any of the above and/or below examples where a rate of coolant return to the first liquid immersion tank is automatically controlled at least in part by heat generation from the computing components in the first liquid immersion tank and wherein a rate of coolant return to the second liquid immersion tank is automatically controlled at least in part by heat generation from computing components in the second liquid immersion tank.

Another example can include any of the above and/or below examples where the rate of coolant return to the first liquid immersion tank is independent of the rate of coolant return to the second liquid immersion tank.

Another example can include any of the above and/or below examples where the coolant return to the first and second liquid immersion tanks is achieved without pumps.

Another example can include any of the above and/or below examples where the liquid immersion tank further comprises a hinged access lid and wherein the vapor outlet is positioned on the hinged access lid.

Another example can include any of the above and/or below examples where the system further comprises first tubing that couples the vapor riser to the vapor outlet and second tubing that couples the liquid riser to the liquid inlet and further comprising a first valve in the first tubing and a second valve in the second tubing, and wherein the first and second valves are configured to be closed when the hinged access lid is opened.

Another example can include any of the above and/or below examples where the first valve comprises a first double valve and the second valve comprises a second double valve, and wherein the first and second double valves can be closed to allow the liquid immersion tank to be removed without leaking coolant from the liquid immersion tank or the phase separator tank.

Another example can include any of the above and/or below examples where the system further comprises a quick disconnect between the first tubing and the vapor outlet and a sanitary flange between the second tubing and the liquid inlet.

Another example can include any of the above and/or below examples where the computing components comprise discrete servers or wherein the computing components comprise groups of processors, groups of memory, and groups of storage.

Another example can include any of the above and/or below examples where the coolant comprises a fluorochemical.

Another example can include any of the above and/or below examples where the phase separator tank and the heat exchanger are defined by a common housing.

Another example can include any of the above and/or below examples including a fan associated with the heat exchanger to increase airflow over the heat exchanger to facilitate heat transfer from the gas phase of the coolant to air surrounding the heat exchanger.

Another example can include any of the above and/or below examples where the system further comprises tubing that circulates a secondary coolant through the heat exchanger to receive heat from the gas phase of the coolant.

Another example includes a system comprising multiple liquid immersion tanks configured to contain servers immersed in a liquid phase of a coolant having a boiling point below a maximum operating temperature of the servers such that operation of the servers generates heat that is transferred to the liquid phase of the coolant and causes a portion of the coolant to boil to a gas phase, a phase separator tank positioned above the multiple liquid immersion tanks and fluidly coupled to an upper region of each of the multiple liquid immersion tanks to receive the gas phase of the coolant, and a heat exchanger positioned above and fluidly coupled to the phase separator tank and configured to remove energy from the gas phase of the coolant so that the gas phase of the coolant transitions back to the liquid phase of the coolant that flows into the phase separator tank, and the phase separator tank further fluidly coupled to lower regions of each of the multiple liquid immersion tanks and wherein a rate of flow of the liquid phase of the coolant from the phase separator tank to an individual liquid immersion tank is automatically controlled by operation of the servers in that individual liquid immersion tank independent of operation of the servers in other individual liquid immersion tanks and without external pumping or monitoring.

Another example can include any of the above and/or below examples where the heat exchanger and the phase separator tank are defined by a common housing.

Another example can include any of the above and/or below examples where the heat exchanger and the phase separator tank are physically separated and fluidly coupled.

Another example includes a system comprising multiple liquid immersion tanks configured to contain servers immersed in a liquid-phase of a coolant having a boiling point below a maximum operating temperature of the servers such that operation of the servers generates heat that is transferred to the liquid phase of the coolant and causes a portion of the coolant to boil to a gas phase of the coolant and a single phase separator tank and a single heat exchanger coupled to the multiple liquid immersion tanks as a sealed cooling system and configured to receive the gas phase of the coolant and configured to transition the gas phase of the coolant back to the liquid phase of the coolant and to automatically deliver some of the liquid phase of the coolant to an individual liquid immersion tank responsive to further boiling producing additional gas phase of the coolant that evacuates from the individual liquid immersion tank.

Another example can include any of the above and/or below examples where the single phase separator tank and the single heat exchanger are integrated together.

Another example can include any of the above and/or below examples where the gas phase of the coolant received at the single phase separator tank comprises a mixture of gas phase and liquid phase coolant.

CONCLUSION

Although the subject matter relating to passive two-phase computer immersion cooling has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising:
   a liquid immersion tank configured to contain computing components positioned directly in liquid phase of a coolant having a boiling point below a maximum operating temperature of the computing components such that operation of the computing components generates heat that is transferred to the liquid phase of the coolant and causes a portion of the coolant to boil to a gas phase, the liquid immersion tank comprising a hinged access lid defining a vapor outlet positioned relatively high on the liquid immersion tank and a liquid inlet positioned relatively lower on the liquid immersion tank;
   a phase separator tank positioned above the liquid immersion tank and comprising a vapor riser and a liquid riser positioned in the phase separator tank and the vapor riser coupled to the vapor outlet on the hinged access lid and extending higher than the liquid riser that is coupled to the liquid inlet; and,
   a heat exchanger positioned above and fluidly coupled to the phase separator tank and configured to remove energy from the gas phase of the coolant so that the gas phase of the coolant transitions back to the liquid phase of the coolant that flows into the phase separator tank, and wherein a rate of flow of coolant from the liquid immersion tank to the phase separator tank is automatically controlled by coolant boiling associated with operation of the computing components.

2. The system of claim 1, wherein the vapor outlet is configured to carry a mixture of gas phase coolant and liquid phase coolant from the liquid immersion tank to the phase separator tank.

3. The system of claim 1, wherein the liquid immersion tank comprises a first liquid immersion tank and the vapor riser comprises a first vapor riser and the liquid riser comprises a first liquid riser and further comprising a second liquid immersion tank coupled to the phase separator tank at a second vapor riser and a second liquid riser.

4. The system of claim 3, wherein a rate of coolant return to the first liquid immersion tank is automatically controlled at least in part by heat generation from the computing components in the first liquid immersion tank and wherein a rate of coolant return to the second liquid immersion tank is automatically controlled at least in part by heat generation from computing components in the second liquid immersion tank.

5. The system of claim 4, wherein the rate of coolant return to the first liquid immersion tank is independent of the rate of coolant return to the second liquid immersion tank.

6. The system of claim 5, wherein the coolant return to the first and second liquid immersion tanks is achieved without pumps.

7. The system of claim 1, wherein the vapor outlet is positioned on a highest portion of the liquid immersion tank.

8. The system of claim 7, further comprising first tubing that couples the vapor riser to the vapor outlet and second tubing that couples the liquid riser to the liquid inlet and further comprising a first valve in the first tubing and a second valve in the second tubing, and wherein the first and second valves are configured to be closed when the hinged access lid is opened.

9. The system of claim 8, wherein the first valve comprises a first double valve and the second valve comprises a second double valve, and wherein the first and second double valves can be closed to allow the liquid immersion tank to be removed without leaking coolant from the liquid immersion tank or the phase separator tank.

10. The system of claim 8, further comprising a quick disconnect between the first tubing and the vapor outlet and a sanitary flange between the second tubing and the liquid inlet.

11. The system of claim 1, wherein the computing components comprise discrete servers or wherein the computing components comprise groups of processors, groups of memory, and/or groups of storage.

12. The system of claim 1, wherein the coolant comprises a fluorochemical.

13. The system of claim 1, wherein the phase separator tank and the heat exchanger are defined by a common housing.

14. The system of claim 1, further comprising a fan associated with the heat exchanger to increase airflow over the heat exchanger to facilitate heat transfer from the gas phase of the coolant to air surrounding the heat exchanger.

15. The system of claim 1, further comprising tubing that circulates a secondary coolant through the heat exchanger to receive heat from the gas phase of the coolant.

16. A system, comprising:
   multiple liquid immersion tanks that include hinged access lids and that are configured to contain servers immersed in a liquid phase of a coolant having a boiling point below a maximum operating temperature of the servers such that operation of the servers generates heat that is transferred to the liquid phase of the coolant and causes a portion of the coolant to boil to a gas phase;
   a phase separator tank positioned above the multiple liquid immersion tanks and fluidly coupled to a vapor outlet on the hinged access lid of each of the multiple liquid immersion tanks to receive the gas phase of the coolant; and,
   a heat exchanger positioned above and fluidly coupled to the phase separator tank and configured to remove energy from the gas phase of the coolant so that the gas phase of the coolant transitions back to the liquid phase of the coolant that flows into the phase separator tank; and,
   the phase separator tank further fluidly coupled to lower regions of each of the multiple liquid immersion tanks and wherein a rate of flow of the liquid phase of the coolant from the phase separator tank to an individual liquid immersion tank is automatically controlled by operation of the servers in that individual liquid immersion tank independent of operation of the servers in other individual liquid immersion tanks and without external pumping or monitoring.

17. The system of claim 16, wherein the heat exchanger and the phase separator tank are defined by a common housing.

18. The system of claim 16, wherein the heat exchanger and the phase separator tank are physically separated and fluidly coupled.

19. A system, comprising:

multiple liquid immersion tanks that include lids positioned on tops of the liquid immersion tanks, the lids defining vapor outlets, the liquid immersion tanks configured to contain servers immersed in a liquid-phase of a coolant having a boiling point below a maximum operating temperature of the servers such that operation of the servers generates heat that is transferred to the liquid phase of the coolant and causes a portion of the coolant to boil to a gas phase of the coolant; and, a single phase separator tank and a single heat exchanger coupled to the vapor outlets of the lids of the multiple liquid immersion tanks as a sealed cooling system and configured to receive the gas phase of the coolant from the vapor outlets and configured to transition the gas phase of the coolant back to the liquid phase of the coolant and to automatically deliver some of the liquid phase of the coolant to an individual liquid immersion tank responsive to further boiling producing additional gas phase of the coolant that evacuates from the individual liquid immersion tank via the vapor outlet on the lid.

20. The system of claim 19, wherein the gas phase of the coolant received at the single phase separator tank comprises a mixture of gas phase and liquid phase coolant.

* * * * *